United States Patent [19]

Hascoe

[11] 3,946,190

[45] Mar. 23, 1976

[54] METHOD OF FABRICATING A SEALING COVER FOR AN HERMETICALLY SEALED CONTAINER

[75] Inventor: Norman Hascoe, Portchester, N.Y.

[73] Assignee: Semi-Alloys Incorporated, Mount Vernon, N.Y.

[22] Filed: Oct. 22, 1974

[21] Appl. No.: 516,889

Related U.S. Application Data

[62] Division of Ser. No. 454,733, March 25, 1974, Pat. No. 3,874,549, which is a division of Ser. No. 257,390, May 26, 1972, Pat. No. 3,823,468.

[52] U.S. Cl. ..................... 219/91; 219/85; 228/253
[51] Int. Cl.² ......................................... B23K 11/10
[58] Field of Search ....... 29/588; 219/85 A, 85 BM, 219/85 CA, 85 CM, 85 D, 85 F, 85 M, 91; 228/122, 251, 253, 255; 174/52 FP

[56] References Cited
UNITED STATES PATENTS

| | | | |
|---|---|---|---|
| 3,415,973 | 12/1968 | Verbeck | 219/91 |
| 3,486,223 | 12/1969 | Butera | 219/85 BM X |
| 3,660,632 | 5/1972 | Leinkram | 219/85 CM |
| 3,683,146 | 8/1972 | Nugent et al. | 219/85 BM |
| 3,693,239 | 9/1972 | Dix | 29/588 X |

FOREIGN PATENTS OR APPLICATIONS

| 313,919 | 1/1934 | Italy | 219/91 |
|---|---|---|---|

*Primary Examiner*—Elliot A. Goldberg
*Assistant Examiner*—N. D. Herkamp
*Attorney, Agent, or Firm*—Laurence B. Dodds

[57] ABSTRACT

A conductive hermetic sealing cover for a container is fabricated by disposing the cover with a superimposed preformed heat-fusible conductive ring having outer dimensions similar to those of the cover in a shallow cavity of a nonconductive supporting member, the cavity having dimensions only slightly larger than those of the cover to secure registration between the ring and the periphery of the cover. A plurality of pairs of spaced electrodes are resiliently engaged with the ring with substantially equal contact pressures and a separate pulse of current is passed between the electrodes of each pair and through the ring and the cover, thereby producing an effective spot weld between the ring and the cover adjacent each of the electrodes. The term "ring" is used herein and in the appended claims in its generic sense to include a closed loop of conductive material of any configuration corresponding to the periphery of the cover, usually round or rectangular. The cover so fabricated is then applied to seal a container consisting of a body having a cavity therein by assembling the cover on the body with the sealing ring in contact with the body surrounding the cavity and then heating the assembly to a temperature sufficient to fuse the ring to the cover and to the body.

6 Claims, 3 Drawing Figures

U.S. Patent  March 23, 1976  3,946,190
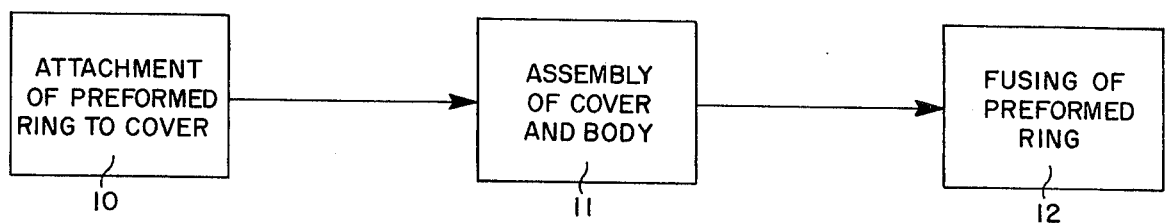
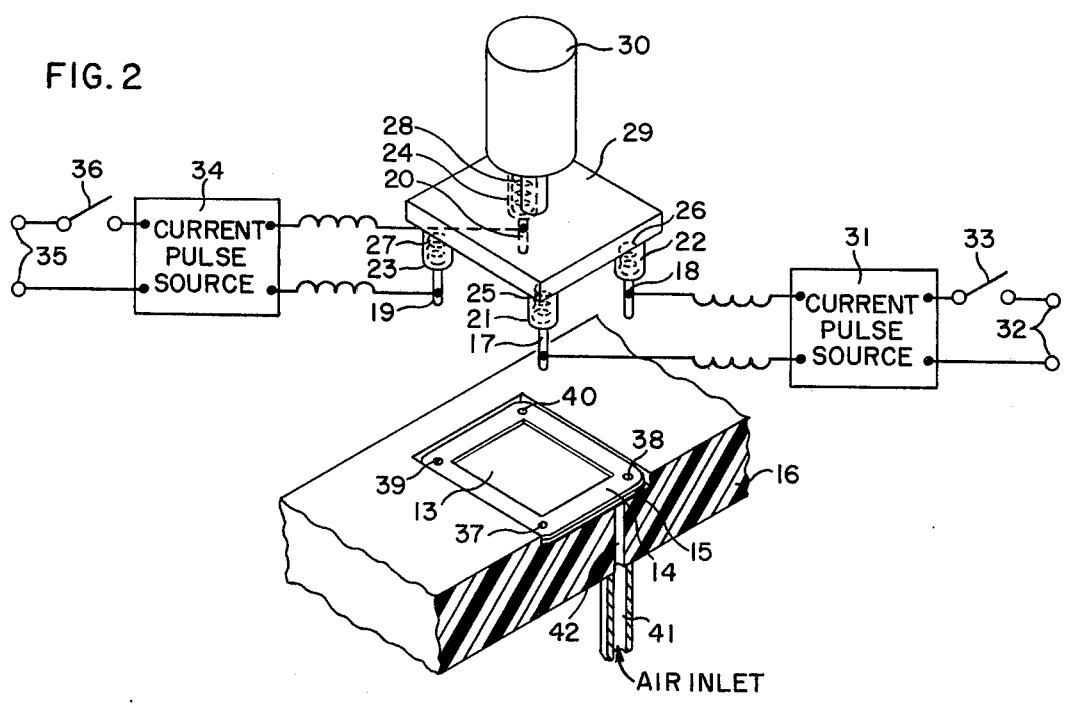
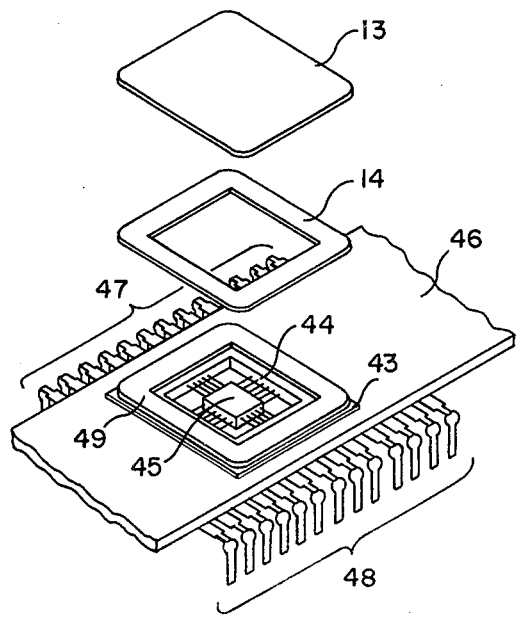

METHOD OF FABRICATING A SEALING COVER FOR AN HERMETICALLY SEALED CONTAINER

CROSS-REFERENCE TO RELATED APPLICATIONS

This application is a division of pending application Ser. No. 454,773, filed Mar. 25, 1974, now U.S. Pat. No. 3,874,549, issued Apr. 1, 1975 entitled "Method of Fabricating an Hermetically Sealed Container and a Sealing Cover Therefor" which, in turn, is a division of application Ser. No. 257,390, filed May 26, 1972, now U.S. Pat. No. 3,823,468, issued July 16, 1974.

BACKGROUND OF THE INVENTION

This invention relates to a method of fabricating a sealing cover for use in fabricating an hermetically sealed container including a semiconductor device.

As is well known, it has become conventional hermetically to seal a semiconductor device in the cavity of a metallic or ceramic body to protect the device from adverse atmospheric effects and to provide physical protection. In the case of a ceramic body, a metallic ring is usually imbedded in or fused into the body surrounding the cavity containing the semiconductor device.

Heretofore it has been the practice hermetically to seal the semiconductor device in the cavity of the body by placing a preformed ring of heat-fusible material, such as a gold-tin eutectic solder, on the body and surrounding the cavity and, in the case of a ceramic body, with an imbedded metallic ring in registry with that ring, and heating the assembly to fuse the ring to the cover and to the body.

The solder material of the ring may be brittle and its dimensions are so small that the ring is very fragile and extremely difficult to handle during assembly. Because of the difficulty of handling such sealing rings, it has also been difficult to ensure accurate registration between the ring and the periphery of the cover and of the cavity in which the semiconductor device is mounted. As a consequence, there has been a substantial yield loss in the finished semiconductor assemblies due to the defects in the hermetic seal.

SUMMARY OF THE INVENTION

In accordance with the invention, the method of fabricating an hermetic sealing cover for a container comprises superimposing a preformed ring of heat-fusible material upon the sealing cover and in registry with the periphery thereof and locally heating the ring to a fusing temperature at a plurality of spaced points, thereby producing an effective attachment between the ring and the cover at each of the points.

For a better understanding of the present invention, together with other and further objects thereof, reference is had to the following description, taken in connection with the accompanying drawing, while its scope will be pointed out in the appended claims.

BRIEF DESCRIPTION OF THE DRAWING

FIG. 1 is a block diagram of an apparatus for fabricating an hermetically sealed container including the fabrication of a sealing cover in accordance with the method of the invention;

FIG. 2 is a perspective view of an apparatus for attaching a preformed solder ring to a cover for the container in accordance with the invention; while FIG. 3 is a perspective exploded view of an hermetically sealed semiconductor device illustrating the method of its fabrication.

DESCRIPTION OF THE PREFERRED EMBODIMENT

Referring now to the drawing, in FIG. 1 are represented, in schematic form, the three basic steps in fabricating an hermetically sealed container. In unit 10, a preformed sealing ring is attached to the cover, as described hereinafter. In unit 11, the cover-ring unit is assembled with the body and in unit 12, which may be a baking oven, the temperature of the assembly is raised to a value at which the sealing ring is fused to the cover and to the body, completing the hermetic seal.

Referring to FIG. 2, there is shown an apparatus suitable for performing the method of fabricating the hermetic sealing cover in accordance with the invention as represented by unit 10 of FIG. 1. In this figure, a flat cover 13 with a superimposed heat-fusible conductive ring 14 is disposed in a shallow cavity 15 of a nonconductive supporting member 16, the cavity having dimensions only slightly larger than those of the cover 13 and the ring 14 to secure registration between the ring 14 and the periphery of the cover. The cover 13 may be, for example, a cobalt-nickel-iron alloy commercially available under the trademark "KOVAR" having a thickness of the order of 0.010 inch while the ring 14 is typically, for example, a gold-tin eutectic alloy having a thickness of the order of 0.002 inch and the same outer dimensions as those of the cover 13. In the drawing, the thickness dimensions of the elements 13 and 14 are greatly enlarged for the sake of clarity.

The assembling apparatus of FIG. 2 further comprises a plurality of pairs of spaced electrodes 17,18 and 19,20, the latter being hidden from view. The electrodes 17–20 are slidably supported in holders 21–24, inclusive, and biased downwardly by enclosed springs 25–28, respectively, depending from an actuating plate 29. The plate 29 is connected to an actuating cylinder 30 of any conventional type so that, when in normal position and depressed downwardly, the electrodes 17–20, inclusive, resiliently engage the sealing ring 14 with substantially equal pressures. A separate pulse of current is then passed between the electrodes of each pair. Specifically, a current pulse from a source 31 is applied between electrodes 17 and 18, the source 31 being excited from power supply terminals 32 through a switch 33. Similarly, a pulse of current is passed between the electrodes 19 and 20 from a current pulse source 34 energized from supply terminals 35 through a switch 36. It is also possible to perform the spot welding by using one power supply where current is passed through the pairs of electrodes as indicated above.

In the operation of the apparatus of FIG. 2, after the cover 13 and sealing ring 14 have been disposed in the cavity 15 as illustrated, the member 29 is depressed by the actuating cylinder 30 so that the electrodes 17–20 resiliently engage the sealing ring 14 at the points 37–40, respectively. In this manner, current flows from one electrode of a pair through the cover and the sealing ring and out of the other electrode. Actually, the current path is divided between the sealing ring and the cover but sufficient current passes through the point where the electrode engages the sealing ring to form a spot weld between the ring and the cover, as indicated. If all of the electrodes were attached to a single power supply, the current would divide between the several electrodes in proportion to the several resistance paths, some electrodes carrying more current than others so that certain of the electrodes might not form a reliable spot weld.

After the sealing ring 14 has been attached to the cover 13 as just described, air is applied through a conduit 41 and a passage 42 through the supporting member 16 to the under side of the cover 13 to blow the cover from the cavity 15, for example into a receiving funnel of an automatic assembling apparatus.

In FIG. 3 is illustrated the method of attachment of the cover-sealing ring unit 13–14, fabricated as described, to a container 43 having a cavity 44 in which is disposed a semiconductor device 45. As indicated, the container 43 is carried by an enlarged supporting member 46 which may be of ceramic material and carries terminal pins 47,48 sealed in the ceramic support 46 and terminating in the leads to the semiconductor device 45. The container 43 may be either of ceramic material or metallic; if ceramic, a conductive ring 49 is fused to the container surrounding the cavity 44.

The assembly represented in FIG. 3 with the cover 13 in place is then passed through a suitable belt furnace, such as the unit 12 of FIG. 1, for fusing the sealing ring 14 to both the cover 13 and the sealing ring 49, hermetically to seal the semiconductor device 45 in the cavity 44.

By the use of the assembling method described, the handling of the unsupported and fragile preformed sealing ring 14 is avoided, the cover 13 being of sufficient rigidity to support this member. Further, there is no possibility that the preformed sealing ring will move out of registry with the lid and with the periphery of the cavity in the body during the sealing operations. Further, there is less likelihood that contamination will reach the sealing area. The method of fabrication described thus realizes lower cost because of lesser manual handling, higher yields, improved performance because of better registry, and minimized loss of parts. It also facilitates the automating of the assembly process for hermetic sealing with the attendant economic advantages of automatic production.

While there has been described what is, at present, considered to be the preferred embodiment of the invention, it will be obvious to those skilled in the art that various changes and modifications may be made therein, without departing from the invention, and it is, therefore, aimed in the appended claims to cover all such changes and modifications as fall within the true spirit and scope of the invention.

What is claimed is:

1. The method of fabricating an hermetic sealing cover for a container comprising:
   superimposing a preformed ring of heat-fusible material upon a cover and in registry with the periphery thereof;
   and locally heating said ring to a fusing temperature at a plurality of spaced points, thereby producing an effective attachment between said ring and said cover at each of said points.

2. The method of fabricating an hermetic sealing cover for a container comprising:
   superimposing a preformed ring of heat-fusible material upon a sealing cover and in registry with the periphery thereof;
   and locally heating said ring to a fusing temperature at a plurality of spaced points by a plurality of spaced heat-generating elements, thereby producing an effective attachment between said ring and said cover at each of said points.

3. The method of fabricating a metallic hermetic sealing cover for a container comprising:
   superimposing a preformed ring of heat-fusible material upon a cover and in registry with the periphery thereof;
   and locally heating said ring to a fusing temperature at a plurality of spaced points by engaging said ring with a plurality of spaced electrodes and passing a pulse of current through each of said electrodes, said ring, and said cover, thereby producing an effective attachment between said ring and said cover at each of said points.

4. The method of fabricating a metallic hermetic sealing cover for a container comprising:
   superimposing a preformed ring of heat-fusible material upon a cover and in registry with the periphery thereof;
   and locally heating said ring to a fusing temperature at a plurality of spaced points by engaging said ring with one or more pairs of spaced electrodes and in which a pulse of current is passed through said ring, said cover, and through the electrodes of each pair in series, thereby producing an effective attachment between said ring and said cover at each of said points.

5. The method of fabricating a metallic hermetic sealing cover for a container comprising:
   disposing the cover with a superimposed preformed ring in a shallow cavity of a nonconductive supporting member, said cavity having dimensions only slightly larger than those of said cover to secure registration between said ring and the periphery of said cover;
   and locally heating said ring to a fusing temperature at a plurality of spaced points, thereby producing an effective attachment between said ring and said cover at each of said points.

6. The method of fabricating a metallic hermatic sealing cover for a container comprising:
   disposing the cover with a superimposed preformed ring in a shallow cavity of a nonconductive supporting member, said cavity having dimensions only slightly larger than those of said cover to secure registration between said ring and the periphery of said cover;
   locally heating said ring to a fusing temperature at a plurality of spaced points, thereby producing an effective attachment between said ring and said cover at each of said points;
   and applying a jet of air to the bottom of said cavity after the fusing process to remove the cover from the cavity.

* * * * *